United States Patent [19]

Shiga

[11] Patent Number: 5,291,042

[45] Date of Patent: Mar. 1, 1994

[54] MULTI-STAGE AMPLIFIER DEVICE AND METHOD FOR PRODUCING THE SAME

[75] Inventor: Nobuo Shiga, Yokohama, Japan

[73] Assignee: Sumitomo Electric Industries, Ltd., Japan

[21] Appl. No.: 873,025

[22] Filed: Apr. 24, 1992

[30] Foreign Application Priority Data

Apr. 26, 1991 [JP] Japan .................................. 3-96872
Apr. 26, 1991 [JP] Japan .................................. 3-96877

[51] Int. Cl.$^5$ ...................... H01L 29/80; H01L 29/48
[52] U.S. Cl. ................................... 257/282; 257/283; 257/476; 257/618
[58] Field of Search ................. 257/282, 283, 476, 618

[56] References Cited

U.S. PATENT DOCUMENTS 5,036,017 7/1991 Noda .................................. 257/282

OTHER PUBLICATIONS

Randall E. Lehmann and David D. Heston, "X-Band Monolithic Series Feedback LNA", IEEE Transactions on Microwave Theory and Techniques, vol. MTT-33, No. 12, pp. 1560–1566 (Dec. 1985).

*Primary Examiner*—Mark V. Prenty
*Attorney, Agent, or Firm*—Beveridge, DeGrandi, Weilacher & Young

[57] ABSTRACT

A multistage amplifier device including an amplifier at the first stage or each of active elements of amplifiers at plural stages containing the first stage and excluding the last stage which is formed of FETs 1a and 1b including a gate having a self-alignment structure, and amplifiers at the remaining subsequent stages which are formed of FETs 1c and 1d including a gate electrode on an operating layer sandwiched between source and drain high impurity density regions, one edge portion at a source side of the gate electrode being overlapped through an insulating layer with the source high impurity density region while the other edge portion at a drain side of the gate electrode does not expand to the drain high impurity density region.

4 Claims, 5 Drawing Sheets

MULTI-STAGE AMPLIFIER DEVICE AND METHOD FOR PRODUCING THE SAME

BACKGROUND OF THE INVENTION

Field of the Invention

This invention relates to a multi-stage amplifier device and a method for producing the same, which is used as a microwave low-noise amplifier for a satellite-broadcast receiving converter, a wideband amplifier for a measuring equipment or the like.

Related Background Art

In association with a recent rapid development of an information net work system, a satellite communication and broadcasting system have been intensively required, and a frequency band of the system has been also required to be further shifted to a higher one. In order to satisfy these requirements, various circuit elements such as a field effect transistor, etc. which can be operated in a high frequency band have been studied and developed. A Schottky-barrier type electric field effect transistor (MESFET) formed of compound semiconductor has been used such as a field effect transistor for high frequency band. Especially GaAs compound semiconductor transistor has been employed because it can break-through a limitation in characteristics of an Si bipolar transistor. In addition, in order to satisfy various requirements such as miniaturization, low-cost and high performance for a system, integration of a first-stage amplifying portion of a down-converter has been recently constructed as MMIC (Microwave Monolithic Integrated Circuit).

In an MMIC low-noise amplifier used in a microwave band, amplifiers at all stages thereof have been conventionally formed of the same FET (Field Effect Transistor), that is, the front and rear stages of the MMIC amplifier are not designed so as to have different FET constructions. In order to attain a low noise amplifier, an FET having a gate structure which is designed in self-alignment with a source and a drain has been practically used.

In order to reduce a noise figure of a FET, it is important to increase transfer conductance gm of the FET and lower gate-source capacitance Cgs of the FET, or to lower source resistance Rs. In order to increase the transfer conductance gm, and to lower the gate-source capacitance Cgs, the gate length of the FET is mainly required to be set to 0.25 μm or less. On the other hand, in order to lower the source resistance Rs, it is mainly required to approach an n+ contact region to the gate as near as possible. If the gate is formed in a self-alignment structure, the gate length could be shortened, and the n+ contact region and the gate could be formed in such a manner that an interval therebetween is remarkably shortened with high reproducibility irrespective of alignment accuracy of an exposing device. The lowering of the source resistance Rs is also effective for the increase of gm and the lowering of an equivalent noise resistance Rn.

As described above, in the conventional MMIC low-noise amplifier used in the microwave band, the amplifiers at all stages are designed using FETs having the self-alignment structure.

However, when the gate is formed in the self-alignment structure as described above, an n+ contact region at the drain side is also nearly approached to the gate, like the n+ contact region at the source side, so that a drain-gate breakdown voltage (a durable maximum voltage to be applied between the drain and the gate) will be lowered.

The MMIC amplifier has a large gain with one chip having a multistage connection. Therefore, even if an input signal power is weak at the first stage, the amplitude of the signal is more intensified as it proceeds to the subsequent stages. Therefore, there frequently occurs a case where a voltage exceeding the drain-gate breakdown voltage of the FET is unintentionally applied between the drain and the gate of the FET, and the FET is damaged. Moreover, in such a type of amplifier, a parameter representing linearity of an amplifier, such as 1dB compression output power of IM$_3$ intercept point, is regarded as an important index value, and a higher index value represents higher performance of the amplifier. If the voltage exceeding the drain-gate breakdown voltage of the FET is applied between the drain and the gate of the FET as described above, the linearity of the amplifier would be deteriorated, and values of the 1dB compression output power and the IM$_3$ intercept point would be reduced.

SUMMARY OF THE INVENTION

An object of this invention is to provide a multistage amplifier device having a low noise figure, high 1dB compression output power and IM$_3$ intercept point, and a large gain.

In order to attain the above object, the multistage amplifier device according to one aspect of this invention includes plural amplifiers which are formed on the same semiconductor substrate, and active element of an amplifier at the first stage or each of active elements of amplifiers at plural stages which contain the first stage and exclude the last stage being formed of a first MESFET, and each of active elements of amplifiers at remaining stages being formed of a second MESFET. The first MESFET has a gate structure in a self-alignment with a source and a drain thereof, and the second MESFET has a gate electrode on semiconductor layer sandwiched between a source high impurity density region and a drain high impurity density region, the gate electrode having one edge portion at a source side which is overlapped through an insulating layer with the source high impurity density region, and having the other edge portion at a drain side which does not extend to the drain high impurity density region.

Since the total noise figure is mainly dependent on the noise figure of the amplifier at the first stage, the amplifiers at the front stages containing the first stage are formed of the first MESFETs having high transfer conductance gm and low noise figure. On the other hand, in the second MESFET the gate electrode is deviated to the source side, and a sufficient interval is kept between the gate electrode and the drain n+ region, so that a large drain-gain breakdown voltage can be obtained. However, the high impurity density region (n+ contact region) at the drain side is disposed far away from the gate electrode. Accordingly, a depletion region extends from a channel to the drain side, and the transfer conductance gm is liable to be reduced because of long effective gate length. Therefore, the second MESFET having this construction is inferior in noise performance to the first MESFET having a gate which is designed in the ordinary self-alignment structure.

In view of the above, in this invention the amplifier at only the first stage, or the amplifiers at some stages containing the first amplifiers and a proper number of subsequent amplifiers are formed of the first MESFETs each including a gate having the ordinary self-alignment structure in which both edge portions of the gate are overlapped with the source and the drain, and the amplifiers at the remaining stages are formed of the second MESFET including a gate having a self-alignment structure at only the source side. With this arrangement, "the low noise performance" and "the high breakdown voltage" can be simultaneously obtained.

According to the multistage amplifier device of another aspect of this invention, the first MESFET is formed on a GaAs epitaxial layer having a first sectional structure and the second MESFET is formed on a GaAs epitaxial layer having a second sectional structure. The GaAs epitaxial layer having the first sectional structure is designed in a pulse dope structure which comprises a channel layer having a high carrier density and a cap layer having low carrier density on the channel layer, and the GaAs epitaxial layer having the second sectional structure has a channel layer having high carrier density, and a cap layer having low carrier density on the channel layer, the cap layer having a multilayer structure and an impurity doping layer as an intermediate layer.

The first MESFET has excellent noise performance, but it also would be provided with low phase-noise performance if it is formed of the GaAs epitaxial layer having the first sectional structure. Therefore, the MESFET thus constructed is more preferably used as a constituent of a low-noise amplifier.

In the second MESFET the gate electrode is deviated to the source side, and a constant interval is kept between the gate electrode and the drain, so that a large drain-gain breakdown voltage can be obtained. However, the high impurity density region (n+ contact region) at the drain side is disposed far away from the gate electrode, a depletion region extends from a channel to the drain side, and the transfer conductance gm is liable to be reduced because of long effective gate length. However, if the second MESFET is formed of the GaAs epitaxial layer having the second sectional structure, the effective gate length would be prevented from being long by the impurity doping layer in the cap layer, and the drain breakdown voltage could be increased without the lowering of gm. In order to obtain a high output power, it is required to make a threshold voltage Vth of the FET low, and as the result, the thickness of the high density pulse dope layer serving as the channel layer should be over a predetermined value. However, in view of the low-noise performance, the thickness of the channel layer is required to be thin for a good performance, and thus the FET having this structure is unsuitable for the amplifier at the first stage.

In view of the above, in this invention, the amplifier at only the first stage, or the amplifiers at some stages containing the first amplifiers and a proper number of subsequent amplifiers are formed of the first MESFET having the GaAs epitaxial layer having the first sectional structure, and the amplifiers at the remaining stages are formed of the second MESFET having the GaAs epitaxial layer having the second sectional structure. With this arrangement, "the low noise performance" and "the high breakdown voltage" can be simultaneously obtained.

A method according to the present invention, for producing the multistage amplifier device having the above structure comprises; the steps of superposedly forming the GaAs epitaxial layer with the second sectional structure on the GaAs epitaxial layer having the first sectional structure, and thereafter, selectively removing the GaAs epitaxial layer with the second sectional epitaxial structure by etching process.

The two kinds of the epitaxial structures (layers) may be selectively grown without the etching process. However, this technique has a problem which is difficult to be overcome in a growth technique and a process technique, and thus it is more easily performed in a manufacturing technique that the GaAs epitaxial layer having the second sectional structure is superposedly formed on the GaAs epitaxial layer having the first sectional structure, and then the GaAs epitaxial layer having the second sectional structure is selectively removed by an etching process.

In place of the above producing method, the following producing method which is inverse to the above method may be adopted. That is, the GaAs epitaxial layer having the first sectional structure is superposedly formed on the GaAs epitaxial layer having the second sectional structure, and then the GaAs epitaxial layer having the first sectional layer is selectively removed by the etching process. In this case, the performance of the FET used at the first stage amplifier is most important, and thus the epitaxial layer having the first sectional structure used at the first stage is preferably formed below the epitaxial layer having the second sectional structure in view of the problem caused by leak current flowing into the substrate.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENT

Preferred embodiments according to this invention will be described hereunder with reference to the accompanying drawings.

A first embodiment of this invention will be first described with reference to FIGS. 1 to 4.

Figure 1:
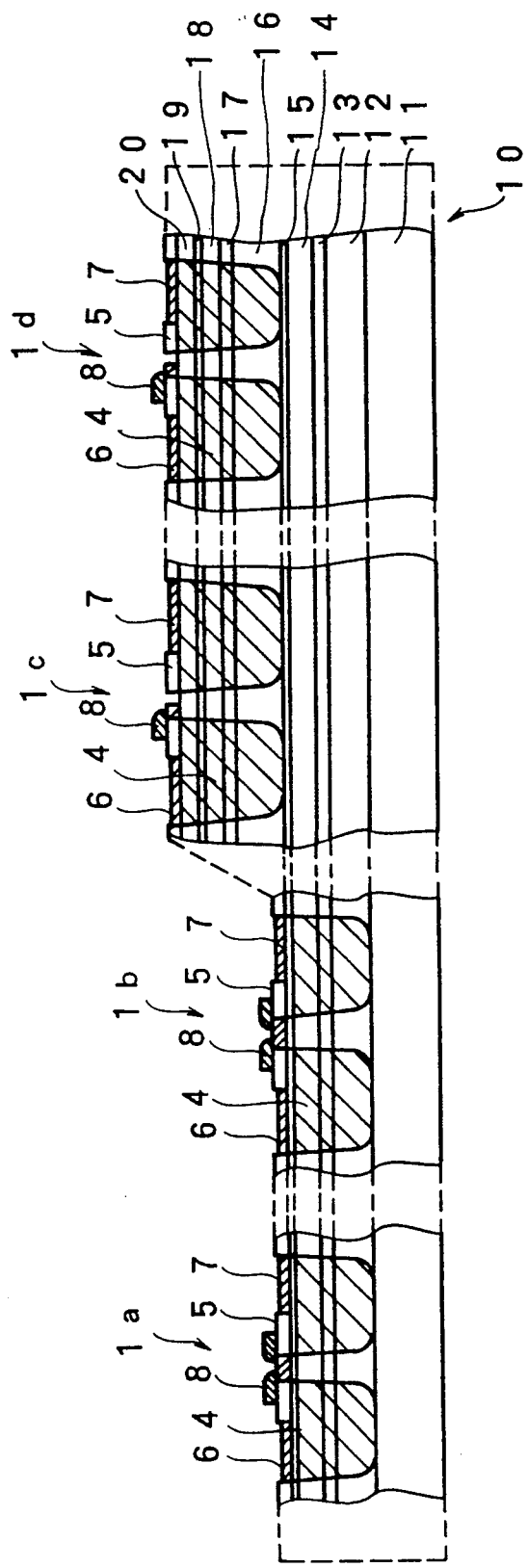
FIG. 1 is a sectional view of a MESFET constituting an amplifier at each stage of a first embodiment of the multistage amplifier device of this invention.
Figure 2:
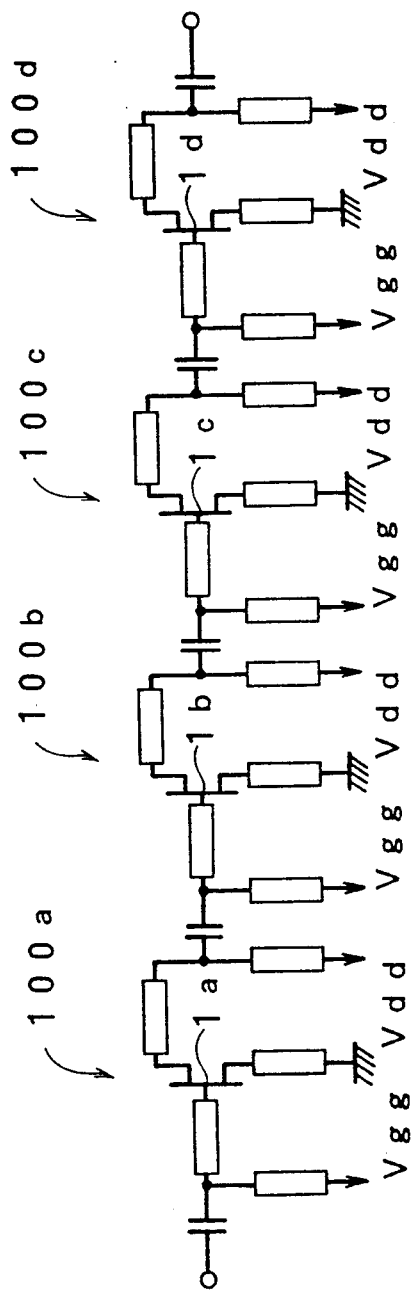
FIG. 2 is an equivalent circuit diagram of the multistage amplifier device as shown in FIG. 1.

As is apparent from FIG. 2, this embodiment is a four-stage cascade-connected type MMIC multi-stage amplifier comprising four amplifiers 100a to 100d, and various elements including FETs 1a to 1d are formed on a GaAs substrate 10.

The GaAs substrate 10 has a double epitaxial structure. The first epitaxial structure comprises an undoped GaAs layer (buffer layer) 12, an Si-doped GaAs layer (channel layer) 13 and an undoped GaAs layer (cap layer) 14 which are continuously grown on a semi-insulating GaAs substrate 11. The second epitaxial structure comprises, an undoped GaAs layer (buffer) layer 16, an Si doped GaAs layer (channel layer) 17, an undoped GaAs layer (cap layer) 18, an Si doped GaAs layer 19 and an undoped GaAs layer (cap layer) 20 which are formed on the semi-insulating GaAs substrate 11 having the layers 12, 13 and 14 as described above.

The undoped GaAs layer 12 is formed in p-density of $2 \times 10^{15}$ cm$^{-3}$ and thickness of 10000 Å, the Si doped GaAs layer 13 is formed in doping density of $4 \times 10^{18}$ cm$^{-3}$ and thickness of 100 Å, and the undoped GaAs layer 14 is formed in n-density below $1 \times 10^{15}$ cm$^{-3}$ and thickness of 300 Å. In addition, the undoped GaAs layer (buffer layer) 16 is formed in p-density of $2.5 \times 10^{15}$ cm$^{-3}$ and thickness of 10000 Å, the Si doped GaAs layer (channel layer) 17 is formed in doping density of $4 \times 10^{18}$ cm$^{-3}$ and thickness of 200 Å, the undoped GaAs layer 18 is formed in n-density below $1 \times 10^{15}$ cm$^{-3}$ and thickness of 150 Å, the Si doped GaAs layer 19 is formed in doping density of $4 \times 10^{18}$ cm$^{-3}$ and thickness of 50 Å, and the undoped GaAs layer 20 is formed in n-density below $1 \times 10^{15}$ cm$^{-3}$ and thickness of 200 Å.

After the double epitaxial structure as described above is formed, an upper portion of the structure which expands from the undoped GaAs layer 16 to the undoped GaAs layer 20 is selectively removed by an etching process. In this case, the etching amount or depth is slightly equal to 1 μm+several angstroms, and thus it is difficult to accurately control the etching amount on the basis of only a time-control. In view of the above, for example, an AlGaAs thin layer 15 is provided as a etch stop layer, and the selective etching process of the GaAs layer can be sufficiently assured by a wet etching process using an etchant having a selective etching capability. As a result, the upper portion can be selectively etched with high controllability using the above wet etching process. As described above, since the AlGaAs thin layer 15 is provided as the etch stop layer for the etching process for selectively removing the upper portion, the AlGaAs thin layer 15 is required to be sufficiently thin to the extent that it has no affection on the operation of the FET.

Recessed portion is formed in the above etching process. Amplifiers 100a and 100b which are respectively the first and second stages are formed in the recessed portions, and amplifiers 100c and 100d which are respectively third and fourth stage are formed in the remaining portion except for the recessed portion.

In this case, each of FETs 1a and 1b constituting the amplifiers 100a and 100b at the first and second stages includes a gate having the ordinary self-alignment structure, but each of FETs 1c and 1d constituting the amplifiers 100c and 100d includes a gate having "the self-alignment structure at only the source side".

All of the FETs 1a, 1b, 1c and 1d commonly have the following basic construction. Source and drain high impurity density regions 4 (portions indicated by oblique lines) are disposed on the GaAs substrate 10 by ion-implantation method, a part of each of the source and drain high impurity density regions 4 is covered by an insulating film 5, source and drain electrodes 6 and 7 are formed at exposed portions of the regions 4 in which the inslating film 5 is removed, and a gate electrode 8 is formed on a semiconductor layer sandwiched between the source and drain high impurity density regions 4. However, there is the following different point in construction between the FETs 1a, 1b, 1c and 1d: each of the gate electrodes 8 of the FETs 1a and 1b is designed such that both edge portions of the gate electrode 8 at the source and drain sides are superposedly provided through the insulating films 5 on the source and drain high impurity density regions 4 while each of the gate electrodes 8 of the FETs 1c and 1d is designed such that one edge portion thereof at the source side is superposedly provided through the insulating film 5 on the high impurity density region 4, but the other edge portion at the drain side does not expand to the high impurity density region 4.

Figure 3:
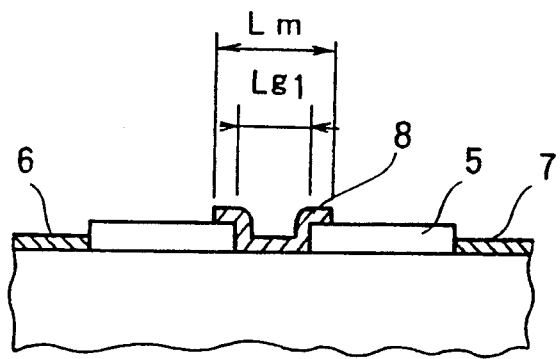
FIG. 3 is an enlarged sectional view of a gate portion of MESFET 1a or 1b.
Figure 4:
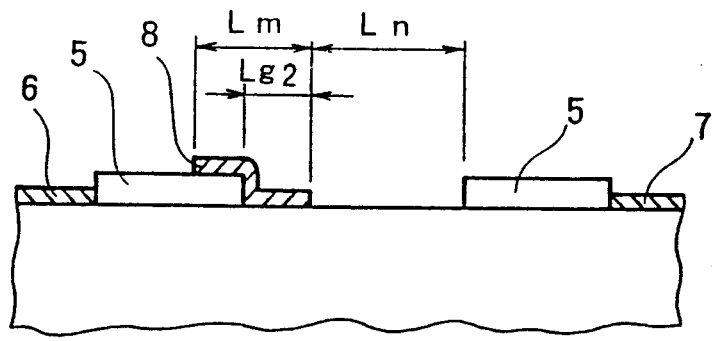
FIG. 4 is an enlarged sectional view of a gate portion of MESFET 1c or 1d.

FIG. 3 is an enlarged sectional view of a gate portion of the FET 1a or 1b, and FIG. 4 is an enlarged sectional view of a gate portion of the FET 1c or 1d. Each gate electrode of the FETs 1a to 1d has a gate metal length Lm of about 0.5 to 1 μm, but the effective length thereof corresponds to the length of a portion excluding the overlapped portion on the insulating film 5. The gate length Lg1 of the FET 1a or 1b is about 0.3 to 0.5 μm, and the gate length Lg2 of the FET 1c or 1d is approximately about 0.2 μm. In the gate portions of the FETs 1c and 1d, the length Ln of a part where no gate electrode is formed is about 1.5 μm.

These FETs can be formed in a lump in the following ordinary process for manufacturing a FET including a gate having the self-alignment structure. That is, a dummy gate is formed on the semiconductor layer in the gate region to form the high impurity density region 4 using the dummy gate as a mask, and an inversion pattern of the dummy gate is formed using the insulating film 5. A part of the pattern is removed to expose a part of the high impurity density region 4. The source and drain electrodes 6 and 7 are formed on the exposed portions of the high impurity density region 4, and the gate electrode 8 is formed on the gate region. In this case, the opening of the mask used in the patterning process of the gate electrode 8 is designed so as to be disposed at such a suitable position that in the FETs 1a and 1b both of the edge portions of each gate electrode at the source and drain sides cover at least a part of each of the source and drain high impurity density regions 4 while in the FETs 1c and 1d the edge portion of each gate electrode at the source side covers at least a part of the source high impurity density region 4, but the other edge portion at the drain side does not cover or expand to the drain high impurity density region 4.

The FETs 1a and 1b at the front stages (first and second stages) include gates having the ordinary self-alignment structure, so that the transfer conductance gm is high and the noise figure is low. In addition, the channel layer 13 is formed as the pulse dope layer in suitable depth from the surface, in high carrier density and in thickness of 100 Å, so that the phase noise is also low. The total noise figure (NF$_T$) of the multistage amplifier is represented by the following equation.

$$NF_T = NF_1 + (NF_2 - 1)/G_1 + (NF_3 - 1)/G_1 G_2 + \cdots + (NF_n - 1)/G_1 g_2 \cdots G_{n-1}$$

Here, $NF_T$ represents total noise figure; $NF_1$, noise figure at the first stage; $NF_2$, noise figure at the second stage; ...; $NF_n$, noise figure at the nth-stage; $G_1$, gain at the first stage; $G_2$, gain at the second stage; ...; $G_{n-1}$, gain at the (n−1)th stage.

As is apparent from the above equation, the total noise figure of the multistage amplifier is mainly dependent on the noise figure of the amplifier at the first stage. Therefore, the multistage amplifier device of this embodiment which uses the amplifiers having low noise figure at the first and second stages has a sufficiently low noise figure.

In addition, a suitable distance $L_n$ is kept between the gate electrode 8 and the drain high impurity density region in the FETs 1c and 1d which are used for the amplifiers at the third and fourth stages, so that the drain-gate breakdown voltage can be set to a large value. As described above, since the large drain-gate breakdown voltage is set in the FETs of the amplifiers at the rear (third and fourth) stages where the signal amplitude is intensified, the values of the 1 dB compression output power and the intercept point can be increased while the linearity of the multi-stage amplifier can be maintained. In addition, since the FETs 1c and 1d are formed on the epitaxial layer having the structure that the cap layer having the multi-layer structure is formed on the channel layer 17 and the impurity doping layer 19 is provided as an intermediate layer of the cap layer, expansion of the depletion region due to a surface level between the gate electrode 8 and the drain high impurity density region 4 can be prevented to the extent that the depletion region does not expand to the channel layer 17. The carrier density and thickness of the impurity doping layer 19 of the cap layer of the GaAs epitaxial layer may be set to such values that a bottom portion of the surface depletion region due to the surface level is disposed between the impurity doping layer 19 and the channel layer 17. Therefore, the high gm can be obtained keeping the sufficient distance between the gate and the drain for high breakdown voltage.

As a method of increasing the drain-gate breakdown voltage are proposed a recess system using a recess structure, and a "slant ion-implantation method" in which ion implantation to the n+ region is carried out in a slant direction from the source to the drain in place of a vertical ion-implantation in which an ion implantation is carried out from the top of the gate to the region n+ region. Since, the recess system, that is, the gate region is removed by the etching process has difficulty in reproducibility and controllability of the etching process, the gate electrode can not be obtained with high reproducibility and uniformity. Therefore, the FET structure of this system is unsuitable for the MMIC. On the other hand, in the slant ion-implantation method, the n+ region can be formed in the self-alignment structure, and the interval between the n+ region and the gate can be designed asymmetrically at the source and drain sides, so that there is a possibility that "low noise performance" and "high breakdown voltage" can be simultaneously obtained. However, in this method, the ion is unintentionally implanted into the channel layer under the gate portion due to the slant ion implantation. As a result, the carrier number is increased and the drain conductance gm is increased, but the gate capacitance Cgs is increased, so that it is difficult to obtain "low noise performance". Rather, the vertical ion-implantation from the top of the gate is more excellent in low-noise performance than the slant ion-implantation method.

Accordingly, the "low-noise performance" and the "high-output power" can be simultaneously obtained by the following construction. The FET at the front stages (first and second stages) are selectively formed by the vertical ion-implantation method to design the FETs at these stages in a structure suitable for the low-noise performance, while the FETs at the rear stages (third and fourth stages) are selectively formed by the slant ion-implantation method to design the FETS at these stages in a structure suitable for the high breakdown voltage. However, in order to selectively form the front stages by the vertical ion-implantation method and selectively form the rear stages by the slant ion-implantation method, the number of masks must be increased, and the processes must be complicated. Therefore, this technique is an unrealistic one.

A second embodiment of this invention will be next described with reference to FIGS. 5 and 6.

Figure 5:
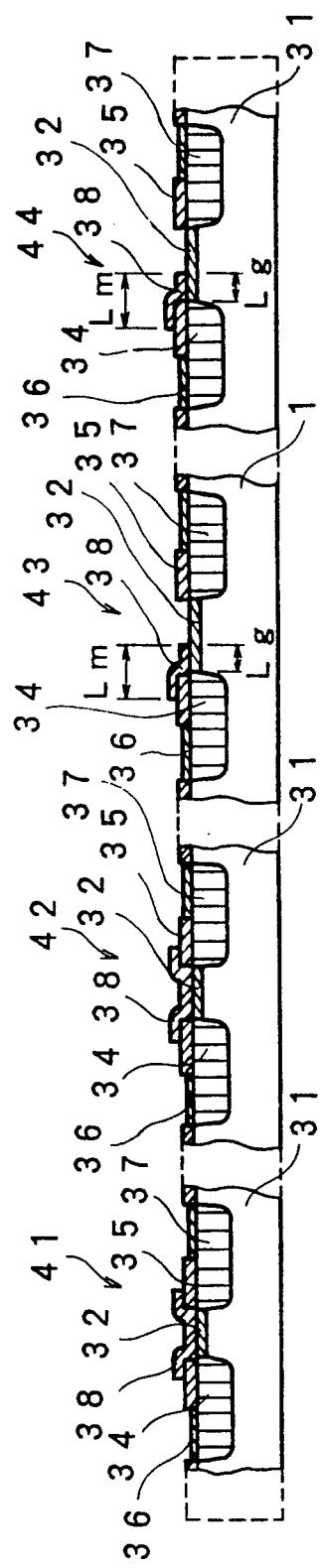
FIG. 5 is a sectional view of a MESFET constituting an amplifier at each stage of a second embodiment of the multistage amplifier device of this invention.
Figure 6:
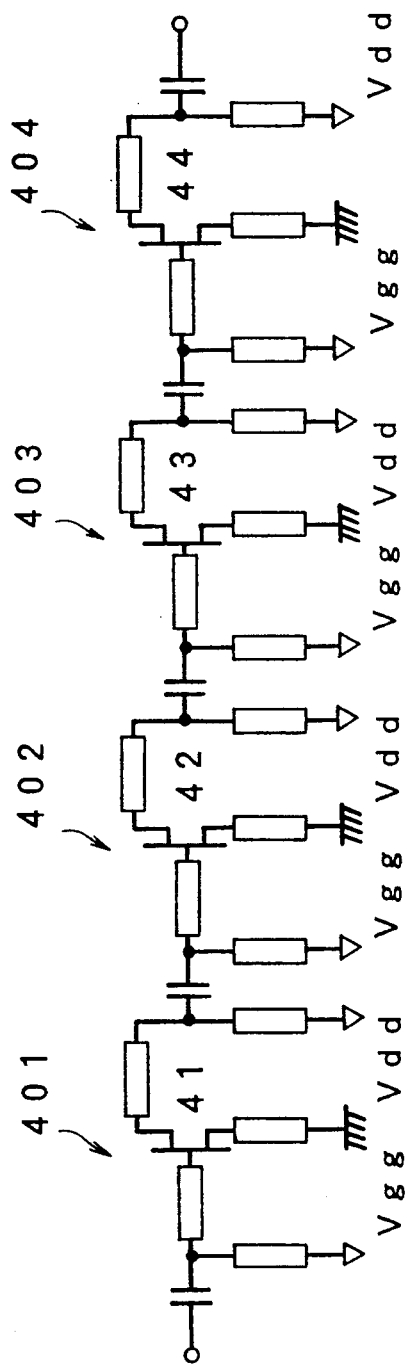
FIG. 6 is an equivalent circuit diagram of the multistage amplifier device as shown in FIG. 5.

FIG. 5 is a sectional structure of an FET portion constituting an amplifier at each stage of the multistage amplifier, and FIG. 6 is an equivalent circuit diagram of the multistage amplifier.

As is apparent from FIG. 6, this embodiment is an example of the MMIC amplifier having the four-stage cascade-connected structure like the first embodiment, and various elements containing FETs 41 to 44 are formed on the semi-insulating GaAs substrate. Each of the FETs 41 to 44 commonly has the same basic construction. That is, an active layer 32 and source and drain high impurity density regions 34 which are disposed so as to sandwich the active layer 32, are formed on a GaAs substrate 31, respective parts (at the sides adjacent to the active layer 32) of the source and drain high impurity density regions 34 are covered by an insulating film 35, exposed portions of the source and drain high impurity density regions 35 are formed with source and drain electrodes 36 and 37, and an gate electrode 38 is formed on the active layer 32.

As shown in FIG. 5, the FETs 41 and 42 constituting the amplifiers 401 and 402 at the first and second stages are designed so as to include a gate having the ordinary self-alignment structure, but the FETs 43 and 44 constituting the amplifiers 403 and 404 at the third and fourth stages are designed so as to include a gate having the self-alignment structure at only the source side. That is, the gate structure of the FETs 41 and 42 used for the amplifiers at the first and second stages has the same shape and size as the FETs 1a and 1b of the first embodiment, and the gate structure of the FETs 43 and 44 used for the amplifiers at the third and fourth stages have the same as the FETs 1c and 1d.

Therefore, in this embodiment, the transfer conductance gm of the FETs 41 and 42 has a larger value, and the noise figures of the amplifier 401 and 402 are low. In addition, the gate-drain breakdown voltage of the FETs 43 and 44 is high. As a result, the multistage amplifier of this embodiment has low noise figure and high gain as a whole.

In the first and second embodiments as described above, the amplifiers at the first and second stages are formed of FETs including the gate having the ordinary self-alignment structure, and the amplifiers at the third and fourth stages are formed of the FETs including the gate having the self-alignment structure at only the source side. However, this invention is not limited to the four-stage cascade-connected structure. In addition, the respective numbers of the stages where the FETs including gates having the ordinary self-alignment structure are used and where the FETs including gates having the self-alignment structure at only the source side are used, are determined in accordance with various factors such as the gain of the amplifier, the amplitude of an input signal, etc., and thus the optimum construction of the multistage amplifying circuit is variable in accordance with these factors.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A multistage amplifier device, comprising:
a plurality of cascade-connected amplifiers formed on a same semiconductor substrate, said plurality including a first stage amplifier and a last stage amplifier, said first stage amplifier having an active element with a first MESFET while said last stage amplifier has an active element with a second MESFET, said first MESFET including a gate structure formed in self-alignment with a source and a drain thereof, and said second MESFET having a gate electrode on a semiconductor layer located between a source high impurity density region and a drain high impurity density region, said gate electrode having a source side edge portion which is located on an insulating film and which overlaps said source high impurity density region and a drain side edge portion which does not extend to said drain high impurity density region.

2. A multistage amplifier device as claimed in claim 1, wherein said first MESFET has a gate electrode having a source side edge portion which is located on an insulating film and which overlaps said source high impurity density region, and a drain side edge portion which is located on an insulating film and which overlaps said drain high impurity density region.

3. The multistage amplifier device as claimed in claim 2, wherein said device has a GaAs epitaxial layer having a first sectional structure and a GaAs epitaxial layer having a second sectional structure which are formed on a surface portion of said semiconductor substrate, said first sectional structure having a pulse dope structure which includes a channel layer of a high carrier density and a cap layer of a low carrier density formed on said channel layer, and said second sectional structure having a channel layer of a high carrier density, a cap layer of a low carrier density on said channel layer, said cap layer having a multilayer structure which includes an impurity doping layer as an intermediate layer, said first and second MESFETs being formed in said epitaxial layers having said first sectional structure and said epitaxial layer having said second sectional structure, respectively.

4. The multistage amplifier device as claimed in claim 3, wherein said carrier density and a thickness of said impurity doping layer of said cap layer of said GaAs epitaxial layer having said second sectional structure are set to values such that a bottom portion of a surface depletion region is disposed between said impurity doping layer and said channel layer.

* * * * *